(12) United States Patent
Jin et al.

(10) Patent No.: US 11,489,535 B1
(45) Date of Patent: Nov. 1, 2022

(54) ANALOG-TO-DIGITAL CONVERTER (ADC) TESTING

(71) Applicant: NXP B.V., Eindhoven (NL)

(72) Inventors: Xiankun Jin, Austin, TX (US); Douglas Alan Garrity, Gilbert, AZ (US); Mark Lehmann, Munich (DE); Kumar Abhishek, Bee Cave, TX (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/302,729

(22) Filed: May 11, 2021

(51) Int. Cl.
*H03M 1/10* (2006.01)

(52) U.S. Cl.
CPC .................. *H03M 1/1014* (2013.01)

(58) Field of Classification Search
CPC ........ H03M 1/66; H03M 1/12; H03M 1/1071; H03M 1/109; H03M 1/1009; H03M 1/46; H03M 1/10; H03M 3/38; H03M 1/08; H03M 1/1023; H03M 1/0607; H03M 3/378
USPC ......................................... 341/110, 118–121
See application file for complete search history.

(56) References Cited

U.S. PATENT DOCUMENTS

| | | | | |
|---|---|---|---|---|
| 5,659,312 A * | 8/1997 | Sunter | ................. | H03M 1/1095 341/120 |
| 5,909,186 A * | 6/1999 | Gohringer | ........... | H03M 1/1071 341/120 |
| 6,154,158 A * | 11/2000 | Walker | ................ | H03M 1/0607 341/118 |
| 6,326,909 B1 * | 12/2001 | Yamaguchi | ......... | H03M 1/1095 341/120 |
| 7,659,841 B1 * | 2/2010 | Newell | ................ | H03M 7/3011 341/120 |
| 8,659,453 B1 * | 2/2014 | Low | ..................... | H03M 1/0658 341/110 |
| 9,188,633 B2 * | 11/2015 | Shimizu | ................. | G01R 31/30 |
| 9,246,503 B1 * | 1/2016 | Hamilton | ............ | H03M 1/1085 |
| 9,350,381 B1 * | 5/2016 | Doare | .................. | H03M 3/378 |
| 9,473,164 B1 | 10/2016 | Chen et al. | | |
| 9,729,160 B1 * | 8/2017 | Marvasti | ............. | H03M 1/1265 |

(Continued)

FOREIGN PATENT DOCUMENTS

WO    WO-2009153766 A1 * 12/2009 .......... H03M 1/1085

OTHER PUBLICATIONS

Jiang, et al.: "Built-in Self-Calibration of On-chip DAC and ADC", 2008 IEEE International Test Conference, May 14-15, 2008, Santa Clara, CA, USA, pp. 61-68.

(Continued)

*Primary Examiner* — Linh V Nguyen

(57) ABSTRACT

Body text indent—does not have paragraph numbering turned on. Not needed in the Abstract. An integrated circuit device includes a digital sine wave generator configured to produce portions of a digital sine wave, a combiner circuit configured to output each of the portions of the digital sine wave combined with a respective calibration code during operation in a post-production dynamic test mode, a digital to analog converter (DAC) configured to output an analog sine wave based on the output of the combiner circuit, and a test analog to digital converter (ADC) including an input terminal directly connected to the output of the DAC, and configured to generate a second digital sine wave based on the analog sine wave.

22 Claims, 2 Drawing Sheets

(56) References Cited

U.S. PATENT DOCUMENTS

| | | | |
|---|---|---|---|
| 2007/0189419 A1* | 8/2007 | Filipovic | H03M 1/122 |
| | | | 375/334 |
| 2011/0098964 A1 | 4/2011 | Mullane et al. | |
| 2017/0328712 A1* | 11/2017 | Collin | H03M 3/458 |
| 2019/0207565 A1* | 7/2019 | de Vreede | H04B 1/0483 |
| 2021/0003633 A1* | 1/2021 | Chen | G01R 31/3167 |

OTHER PUBLICATIONS

Mullane, et al.: "A2DTest: A complete integrated solution for on-chip ADC self-test and analysis", 2009 International Test Conference, Nov. 1-6, 2009, Austin, TX, USA, pp. 1-10.

Teraoka, et al.: "A built-in self-test for ADC and DAC in a single-chip speech CODEC", Proceedings of IEEE International Test Conference—(ITC), Oct. 17-21, 1993, Baltimore, MD, USA, pp. 791-796.

Yu, et al.: "Efficient loop-backtesting of on-chip ADCs and DACs", Proceedings of the ASP-DAC Asia and South Pacific Design Automation Conference, 2003, Jan. 24-24, 2003, Kitakyushu, Japan, pp. 1-6.

Zhuang, et al.: "High-Purity Sine Wave Generation Using Nonlinear DAC With Predistortion Based on Low-Cost Accurate DAC-ADC Co-Testing", IEEE Transactions on Instrumentation and Measurement (vol. 67, Issue: 2, Feb. 2018), IEEE, pp. 279-287.

Jiang, Wei, "Built-in Self-Test and Calibration of Mixed-signal Devices", PhD Dissertation, May 9, 2011, pp. 1-133, Auburn University, Alabama, USA; retrieved from the internet at http://www.eng.auburn.edu/~agrawvd/THESIS/JIANG/wj_phd_fin.pdf on Sep. 20, 2017.

* cited by examiner

US 11,489,535 B1

ANALOG-TO-DIGITAL CONVERTER (ADC) TESTING

BACKGROUND

Field

This disclosure relates generally to analog-to-digital converters (ADCs), and more specifically, to testing ADCs.

Related Art

Analog-to-Digital Converters (ADCs) are key components in a wide variety of electronic systems in the form of integrated circuits (ICs), such as in system-on-chips (SoCs) or discrete components. Testing of ADCs is typically done in production, during the manufacturing of the integrated circuits, by precise external tester equipment. This dependence on tester equipment, though, increases testing cost and prevents the ability to achieve high test parallelism. Therefore, a need exists for integrated circuits with built-in testing capability for ADCs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Testing of ADCs is often desired during production, and may also be desired during use in the field (i.e. post-production). In one aspect, an IC having an ADC to be tested includes a test circuit capable of performing on-chip ADC performance testing, including both static and dynamic testing. In one embodiment, performing dynamic testing of the ADC includes generating a coherent staircase sine wave on-the-fly within the IC, and directly providing the generated staircase sine wave to the ADC under test. Using the results of the ADC under test, it can be determined if the performance of the ADC is sufficient (i.e. if the ADC passes or fails testing). Each ADC in the IC can be tested in this manner. By doing this ADC testing fully on-chip, high testing parallelism can be leveraged during production, since external testers are not required, and ADC testing can also be performed during use of the IC in the field (after production).

Figure 1:
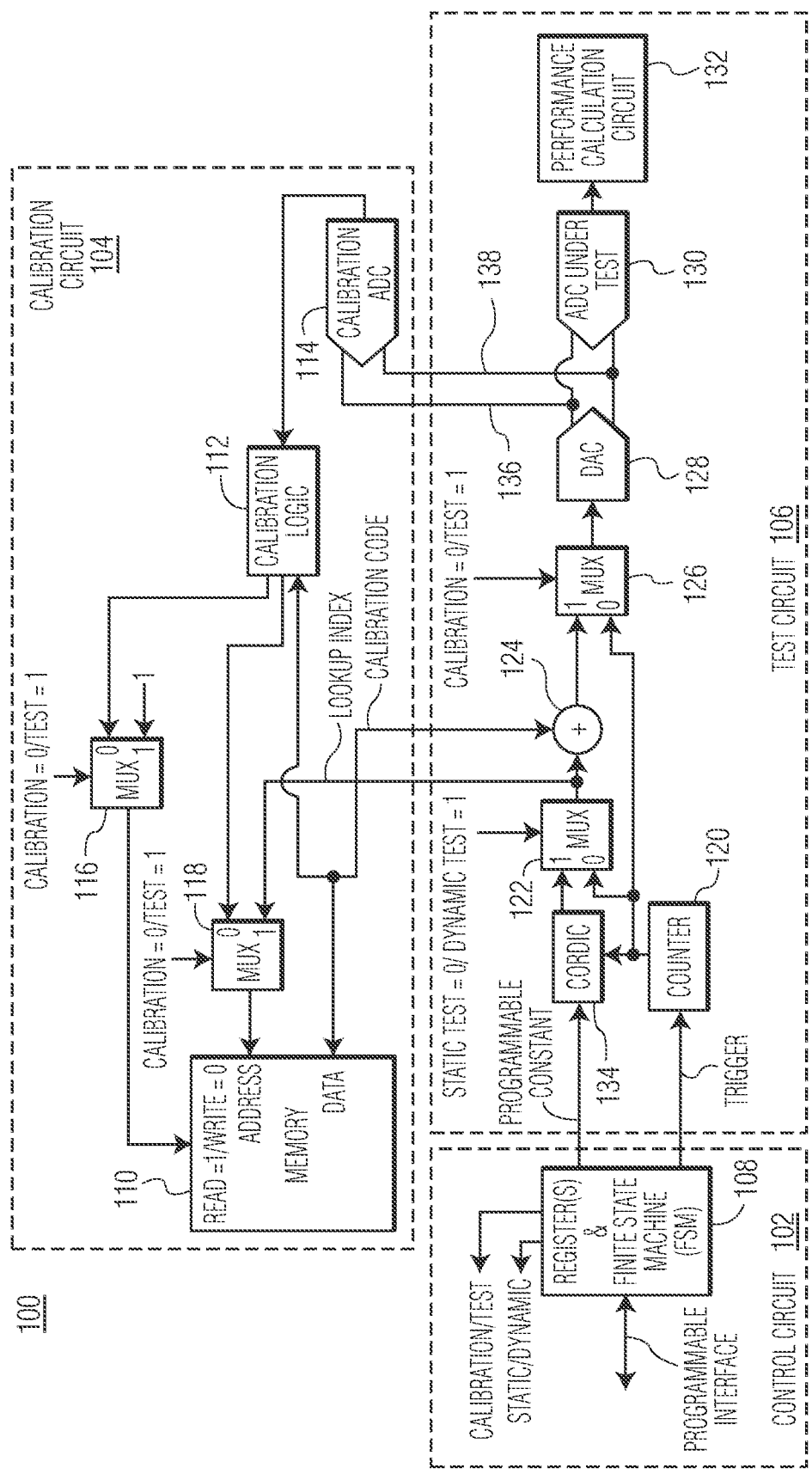
FIG. 1 illustrates, in block diagram form, an IC having an ADC, in accordance with one embodiment of the present invention.

FIG. 1 illustrates an IC 100 (which may be implemented with a single IC or in a system on a chip (SoC)) including a calibration circuit 104, a test circuit 106, and a control circuit 102. Test circuit 106 includes an ADC 130, in which ADC 130 is considered the ADC under test for the descriptions herein (and may therefore also be referred to as the test ADC). Note that the same descriptions apply to any ADC on IC 100 in which all or portions of calibration circuit 104, control circuit 102, and test circuit 106 can be shared or reused for the testing other ADCs. In one embodiment, as will be described in more detail below, portions of calibration circuit 104 may be located off-chip (i.e. external to IC 100). Also, note that the circuitry of test circuit 106 and control circuit 102 which is located within IC 100 can be referred to as built-in self-test (BIST) circuitry, specifically BIST circuitry for testing ADC performance.

Calibration circuit 104 includes a memory 110 (which can be implemented with any type of memory or storage element), multiplexors (MUXes) 116 and 118, calibration logic 112, and a calibration ADC 114. In one embodiment, all of the circuitry within calibration circuit 104 is located on-chip, i.e. within IC 100. In an alternate embodiment, portions may be located off-chip, i.e. external to IC 100. For example, calibration logic 112 or calibration ADC 114, or both, may be located off-chip. Test circuit 106 includes a Coordinate Rotation Digital Computer (CORDIC) 134, counter 120, adder 124, MUXes 122 and 126, a digital-to-analog converter (DAC) 128, ADC 130, and a performance calculation circuit 132. Control circuit 102 includes one or more registers and a Finite State Machine (FSM) 108.

Conductors 136 and 138 communicate the output of DAC 128 to an input of calibration ADC 114. In the illustrated embodiment, DAC 128, calibration ADC 114, and ADC 130 each communicate a pair of differential signals. Alternatively, each may communicate a single-ended signal. Calibration ADC 114 provides a digital output to calibration logic 112. Calibration logic 112 provides a first output to a first input (the "0" input) of MUX 116 and a second output to a first input (the "0" input) of MUX 118. A second input (the "1" input) of MUX 116 is tied to a voltage supply node which provides a first supply voltage, Vdd, corresponding to a logic level one. A second input (the "1" input) of MUX 118 is coupled to receive a lookup index from test circuit 106. A control input of MUX 116 and MUX 118 receive a calibration/test bit in which a value of zero indicates calibration mode and a value of one indicates test mode. An output of MUX 116 is coupled to a read/write input of memory 110, in which a one indicates a read transaction and a zero a write transaction. An output of MUX 118 provides an address value to an address input of memory 110. Calibration codes are communication between calibration logic 112, a data input of memory 110, and test circuit 106.

Control circuit 102 includes one or more register(s) and FSM 108, and is coupled via a programmable interface to a master of IC 100 or to an external port, so as to receive and store the FSM and the values within the one or more registers. The FSM can output the calibration/test bit and the static/dynamic bit, as needed, during calibration and during testing, and controls the execution sequence of the calibration and the testing (and thus may be considered as part of the BIST circuitry since it allows for automatic control of the BIST circuitry). The FSM also outputs a trigger signal to test circuit 106 which operates to trigger counter 120 to start counting. Register(s) and FSM 108 may also provide any necessary reset values or control inputs to test circuit 106 or calibration circuit 104. For example, a programmable constant value can be stored in a register which is provided to CORDIC 134 to set the frequency of its generated sine wave.

CORDIC 134 receives the programmable constant from control circuit 102, and counter 120 receives a trigger signal from control circuit 102. CORDIC 134 provides an output to a first input (the "1" input") of MUX 122, and an output of MUX 122 is provided to a second input (the "1" input) of MUX 118 and a first input of adder 124. A second input of adder 124 is coupled to receive calibration codes from memory 110, and an output of adder 124 is provided to a first input (the "1" input) of MUX 126. Counter 120 provides an output (e.g. a count value) to CORDIC 134, to a second input (the "0" input) of MUX 122, and to a second input (the "0" input) of MUX 126. A control input of MUX 122 receives a static/dynamic bit, in which a zero indicates that static testing is being performed and a one indicates that dynamic testing is being performed. An output of DAC 128 (illustrated as a differential output) is provided to an input of ADC 130 (illustrated as a differential input). An output of ADC 130 is provided to performance calculation circuit 132.

For each of MUX illustrated herein, an output of the MUX provides either the first input or the second input as output, based upon the control bit. If the control bit is a zero, then the MUX provides the input coupled to the "0" input as the output, and if the control bit is a one, then the MUX provides the input coupled to the "1" input as the output.

In operation, calibration circuit 104 provides calibration for DAC 128. Calibration circuit 104 determines calibration codes using calibration ADC 114 and calibration logic 112, and stores the calibration codes in memory 110. During calibration, control circuit 102 provides the calibration/test bit as a zero. This results in the first output of calibration logic 112 being provided by MUX 116 to the read/write input of memory 110, the second output of calibration logic 112 being provided by MUX 118 to the address input of memory 110, and the output of counter 120 being provided by MUX 126 to DAC 128. FSM 108 also controls the execution sequence of the calibration.

For calibration (i.e. in calibration mode), counter 120 is triggered by the FSM to generate digital codes corresponding to a ramp, and provide those digital codes to DAC 128. DAC 128 converts the digital code into an analog ramp. The DAC output is then converted by calibration ADC 114 to a digital signal which is provided to calibration logic 112. The calibration logic interprets the results as the nonlinearity of DAC 128. Calibration logic 112 provides a zero to the read/write input of memory 110 via MUX 116, an address value to the address input of memory 110 via MUX 118, and provides a corresponding calibration code to the data port of memory 110, such that the calibration code gets stored into memory 110 at the appropriate location. In one embodiment, each value of counter 120 as it generates the ramp input to DAC 128 provides the address location at which the corresponding calibration code is stored. For example, DAC 128 may be a 14-bit DAC and counter 120 a 14-bit counter. Each 14-bit counter value (e.g. all zeros up to all ones) may correspond to an address location of memory 110 at which the calculated calibration code (determined by calibration logic 112 based on the 14-bit counter value being provided to DAC 128 and the output of DAC 128 to calibration ADC 114) is stored. That is, memory 110 can be implemented as a content addressable memory (CAM). Note that calibration logic 112, if located on-chip, can operate as a master which can read/write to memory 110 directly.

In one embodiment, a calibration scheme utilizes a higher resolution ADC for calibration ADC 114, which is more accurate than DAC 128 in order to calibrate DAC 128 to a satisfactory performance. For example, the higher resolution ADC has a higher bit precision than DAC 128, and therefore converts the analog signal to a more accurate digital representation than what was provided to DAC 128. Since ADC 114 has a higher precision, ADC can convert the analog ramp signal from DAC 128 to a digital reproduction of the analog ramp signal that is more accurate than a digital reproduction of the analog ramp signal which would be produced by ADC 130. In this case, for the more accurate calibration ADC (which has greater precision than ADC 130), calibration ADC 114 may be located off-chip. In this embodiment, any known calibration logic may be used to implement calibration logic 112 to determine calibration codes for DAC 128, in which calibration logic 112 can also be located off-chip. Also, in one embodiment, ADC 114 has a Nyquist-rate ADC configuration.

In an alternate embodiment, calibration logic 112 may use a calibration scheme which is performed on-chip (i.e. within IC 100). For example, calibration logic 112 may implement the uSMILE-ROME algorithm as described in "High-Purity Sine Wave Generation Using Nonlinear DAC With Predistortion Based on Low-Cost Accurate DAC-ADC Co-Testing", published in *IEEE Transactions on Instrumentation and Measurement*, vol. 67, no. 2, pp. 279-287. The uSMILE-ROME algorithm relies on an accurate voltage offset implemented either in DAC 128 or calibration ADC 114, thus the absolute accuracy of calibration ADC 114 is not required. In this case, calibration ADC 114 may be located on-chip, or, alternatively, ADC 130 itself (or another existing ADC in IC 100) can be utilized as calibration ADC 114. The ability to reuse an ADC in IC 100 as a calibration ADC further helps reduce circuit area of IC 100.

For testing (i.e. in test mode), ramp code values (generated by counter 120) or sine wave codes (generated by CORDIC 134) are provided to DAC 128 which creates the analog ramp for ADC static testing or the analog staircase sine wave for ADC dynamic testing, respectively. During testing, control circuit 102 provides the calibration/test bit as a one. This results in a logic level one being provided by MUX 116 to the read/write input of memory 110, such that, during testing, memory 110 can only be read. This also results in the output of MUX 118 providing the output of MUX 122 as the lookup index to the address input of memory 110. The output of adder 124 is provided by MUX 126 to DAC 128. FSM 108 also controls the execution sequence of the testing (and thus the FSM may also be referred to as the test controller or BIST controller).

Based on the static/dynamic bit, MUX 122 passes either the ramp values (from counter 120) or the sine wave values (from CORDIC 134) as control codes to adder 124. Note that for dynamic testing, CORDIC 134 generates digital control codes (in binary format) corresponding to respective portions of a sine wave in discrete time steps. The output of MUX 122 is also used as a lookup address (i.e. lookup index) provided to the address input of memory 110 (with a one provided to the read/write input of memory 110) so as to retrieve the corresponding calibration code from memory 110 to add to the control code at the output of MUX 122. The output of adder 122 is provided via MUX 126 as a DAC control word to DAC 128. Therefore, adder 124 may also be referred to as a combiner junction or combiner circuit which combines control codes from MUX 122 with calibration codes from memory 110. In one embodiment, the discrete values (i.e. control codes) provided by CORDIC 134 to implement the sine wave includes the same number of bits as counter 120. Due to the previous calibration of DAC 128 using a ramp from counter 120, each value of CORDIC 134 or counter 120 has a corresponding calibration code stored in memory 110.

CORDIC 134 receives a programmable constant from register(s) and FSM 108 as an input angle to meet coherency requirements on-the-fly. The input angle also determines the frequency of the sine wave implemented by CORDIC 134. In one embodiment, the programmable constant provides a programmed constant step size to CORDIC 134. Any known implementation of a CORDIC may be used for CORDIC 134. The ability of CORDIC 134 to generate a coherent sine wave on-the-fly (i.e. when needed), eliminates the need for storing large lookup tables to store multiple sine waves and provides improved flexibility for generating the sine wave (such as by implementing any desired sample rate by CORDIC 134).

The DAC control word is converted by DAC 128 and provided to ADC 130 (i.e. the ADC under test). In the case of dynamic testing, the generated digital codes for the sine wave from CORDIC 134, as adjusted by the corresponding calibration code, is provided to DAC 128, in which DAC 128 provides an analog staircase sine wave to ADC 130. ADC 130 then converts the analog staircase sine wave to a digital reproduction of the analog staircase sine wave. As will be described in more detail below, during either static or dynamic testing, the output of DAC 128 is provided directly to ADC 130. That is, the output of DAC 128 is directly connected to the input of ADC 130, without any intervening filter.

The outputs of ADC 130 can then be provided to performance calculation circuit 132. Any known performance calculation can be performed to determine if ADC 130 is performing satisfactorily. For example, performance calculation circuit 132 may perform a Fast Fourier Transform (FFT) to convert the results from time domain to frequency domain in order to obtain performance parameters, such as, e.g. the signal to noise ratio (SNR) and Total Harmonic Distortion (THD), which can be compared to expected or acceptable ranges for each performance parameter. If all parameters are within acceptable performance limits, then ADC 130 is determined to have passed the BIST. Note that performance calculation circuit 132 can be referred to as a performance monitor and implement any type of performance monitoring.

Figure 2:
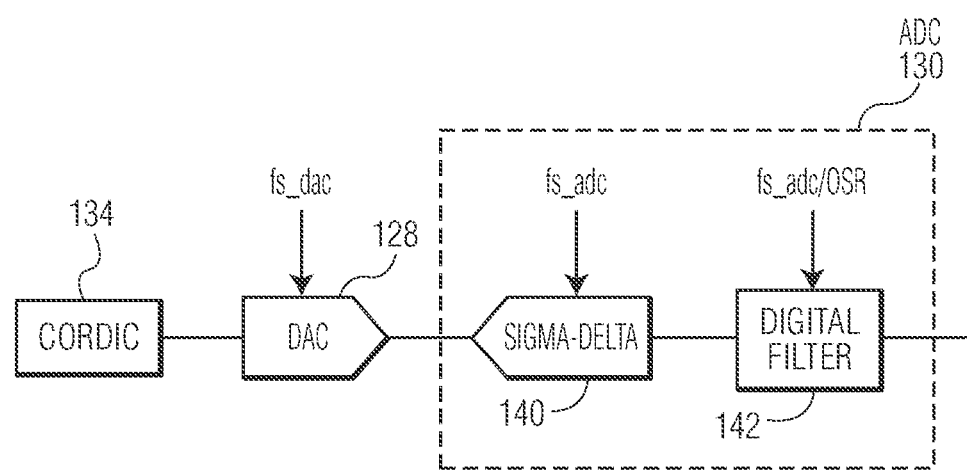
FIG. 2 illustrates, in block diagram form, a portion of the test circuit of the IC of FIG. 1, in accordance with one embodiment of the present invention.

FIG. 2 illustrates a portion of test circuit 106, in which ADC 130 is implemented as a sigma-delta ADC (SD ADC) which includes a sigma-delta modulator 140 followed by a digital filter 142. Note that DAC 128 is directly connected to sigma-delta modulator 140, without any intervening filter. Also, DAC 128 uses a corresponding sampling rate, fs_dac, sigma-delta modulator 140 uses a corresponding sampling rate, fs_adc, and digital filter 142 uses a corresponding sampling rate, fs_adc/OSR (in which OSR is the OverSampling Ratio). In the illustrated embodiment, a staircase sine wave is used to test the SD ADC directly without a low pass filter, which reduces the complexity and cost of the on-chip implementation. Without the low pass filter between the DAC and SD ADC, certain constraints on the sampling frequencies may be useful.

In one example, CORDIC 134 generates the digital codes that correspond to a sine wave with 14-bit resolution due to quantization noise. (Similarly, it is assumed that counter 120 is a 14-bit counter.) The digital codes from CORDIC 134 for the sine wave are converted by DAC 120 into a staircase sine wave. The staircase sine wave is effectively processed by a zero-order hold (ZOH) due to the inherent stairstep output of DAC 120, which in turn suppresses the aliased images at multiples of the DAC clock rate. When the test frequency (ft_in, corresponding to the frequency of the sine wave generated by CORDIC 134 or at the output of DAC 128) is significantly smaller than the fs_dac, the aliased images are pushed to be close to multiples of N times fs_dac, in which N is an integer. In this example, significantly smaller refers to being within the passband of sigma-delta modulator 140 and digital filter 142, which is smaller than the fs_adc/OSR. The noise shaping property of sigma-delta modulator 140 suppresses the low frequency in-band quantization noise. When fs_adc is an integer times fs_dac, the aliased images will end up falling out of the input bandwidth of ADC 130 and will therefore be removed by digital filter 142.

Therefore, in one embodiment, the programmable constant of CORDIC 134 and fs_dac is set such that ft_in is significantly smaller than fs_dac, and fs_adc is set so that it is an integer multiple of fs_dac. For example, when fs_dac=1 MHz, fs_adc=40 MHz, ft_in=20 KHz, and the passband=111 kHz, the aliased images of ft_in will be filtered out and thus not impact the DAC-SD ADC loop test results.

Any of the testing performed by test circuit 106 and control circuit 102 can be performed on-chip, as BIST. The ability to implement the testing as BIST allows for the static or dynamic testing to be performed post-production of IC 100. That is, IC 100 can be programmed to perform the testing as needed during normal operation. This allows for the determination of reduced performance of an ADC at any point after production.

Therefore, by now it can be appreciated that a testing architecture for an IC which supports both ADC static and dynamic performance testing. Furthermore, the testing architecture allows for DAC calibration as well as the production of a coherent staircase sine wave on-the-fly. Also, through the use of a DAC-SD ADC co-test scheme, as illustrated in FIG. 2, the testing can be performed without low pass filtering between the DAC and SD-ADC. In one embodiment, the testing can be implemented on-chip as BIST circuitry, which allows for post-production testing. In one embodiment, the calibration may also be implemented fully on-chip.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, memory 110 can use different addressing schemes to store the calibration codes, rather than be implemented as a content addressable memory (CAM). Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit in a single semiconductor die includes a coordinate rotation digital computer (CORDIC) configured to generate digital control codes in binary format that correspond to respective portions of a sine wave signal in discrete time steps during operation in a post-production dynamic test mode; a digital to analog converter (DAC) configured to receive the digital control codes, convert the digital control codes to an analog staircase sine wave signal, and provide the analog staircase sine wave signal at an output terminal; an analog to digital converter (ADC) under test including an input terminal connected directly to the output terminal of the DAC to receive the analog staircase sine wave signal and configured to convert the analog staircase sine wave signal to a digital reproduction of the analog staircase sine wave signal; and a performance monitor circuit configured to determine whether the digital reproduction of the analog staircase sine wave signal is within acceptable performance limits during operation in the post-production dynamic test mode. In one aspect, the integrated circuit further includes a calibration ADC including an input terminal connected directly to the output terminal of the DAC to receive an analog ramp signal during operation in a calibration mode, and configured to convert the analog ramp signal to a digital reproduction of the analog ramp signal that is more accurate than a digital reproduction of the analog ramp signal produced by the ADC under test during operation in the calibration mode. In a further aspect, the integrated circuit further includes calibration logic configured to generate calibration codes for the digital reproduction of the analog ramp signal produced by the calibration ADC. In another aspect, the integrated circuit further includes a combiner junction configured to combine each of the digital control codes for the sine wave signal with a corresponding calibration code, wherein the DAC receives each portion of the digital control codes with the corresponding calibration code. In yet another aspect, the integrated circuit further includes a control circuit configured to provide a programmed constant step size to the CORDIC. In another aspect, a sample frequency of the DAC is larger than an output frequency of the DAC. In a further aspect, a sample frequency of the ADC under test is an integer multiple of a sample frequency of the DAC. In yet an other aspect of the above embodiment, the integrated circuit further includes a digital filter following a sigma-delta modulator portion of the ADC, wherein the digital filter removes high frequency noise and alias images from the reproduction of the analog staircase sine wave signal. In another further aspect, the ADC under test has a sigma-delta configuration and the calibration ADC has a Nyquist-rate ADC configuration. In another aspect, the integrated circuit further includes a multiplexer including a first input, a second input, an output, and a control input configured to select the first input as a mux output during operation in the post-production dynamic test mode and to select the second input as the mux output during operation in a static test mode; a counter circuit configured to provide counter values to the second input of the multiplexer; the CORDIC is configured to provide the digital control codes to the first input of the multiplexer. In a further aspect, the integrated circuit further includes a combiner junction configured to combine the output of the multiplexer with a corresponding calibration code, and the DAC receives output of the combiner junction.

In another embodiment, an integrated circuit device includes a digital sine wave generator configured to produce portions of a digital sine wave; a combiner circuit configured to output each of the portions of the digital sine wave combined with a respective calibration code during operation in a post-production dynamic test mode; a digital to analog converter (DAC) configured to output an analog sine wave based on the output of the combiner circuit; a test analog to digital converter (ADC) including an input terminal directly connected to the output of the DAC, and configured to generate a second digital sine wave based on the analog sine wave. In one aspect of the another embodiment, the integrated circuit device further includes a performance monitor circuit configured to determine whether performance characteristics of the second digital sine wave are within specified limits. In another aspect, the integrated circuit device further includes a calibration ADC including an input terminal connected directly to the output terminal of the DAC to receive an analog ramp signal during operation in a calibration mode, and configured to convert the analog ramp signal to a digital reproduction of the analog ramp signal that is more accurate than a digital reproduction of the analog ramp signal produced by the ADC under test during operation in the calibration mode. In a further aspect, the integrated circuit device further includes calibration logic configured to generate calibration codes for the digital reproduction of the analog ramp signal produced by the calibration ADC. In another aspect, the integrated circuit device further includes a control circuit configured to provide a programmed constant step size to the sine wave generator, wherein the sine wave generator is a coordinate rotation digital computer (CORDIC). In yet another aspect, a sample frequency of the DAC is greater than an output frequency of the DAC; and a sample frequency of the test ADC is an integer multiple of a sample frequency of the DAC. In another further aspect, the integrated circuit device further includes a digital filter in the test ADC, wherein the digital filter removes high frequency noise and alias images from the reproduction of the digital staircase sine wave signal produced by the test ADC. In another aspect of the another embodiment, the integrated circuit device further includes a multiplexer including a first input, a second input, an output, and a control input configured to select the first input as a mux output during operation in the post-production dynamic test mode and to select the second input as the mux output during operation in a static test mode; a counter circuit configured to provide counter values to the second input of the multiplexer; the sine wave generator is configured to provide the control codes to the first input of the multiplexer; and the combiner circuit is configured to receive the output of multiplexer.

In yet another embodiment, a method for testing an analog to digital converter (ADC) in a system on a chip includes during post-production dynamic testing: providing calibrated portions of a digital sine wave to a digital to analog converter; converting the portions of the digital sine wave to an analog sine wave in a digital to analog converter (DAC); providing the analog sine wave directly from the DAC to the ADC; converting the analog sine wave to a second digital sine wave in the ADC; and determining whether performance characteristics of the second digital sine wave are within specified limits.

What is claimed is:

1. An integrated circuit in a single semiconductor die comprising:
a coordinate rotation digital computer (CORDIC) configured to generate digital control codes in binary format that correspond to respective portions of a sine wave signal in discrete time steps during operation in a post-production dynamic test mode;
a digital to analog converter (DAC) configured to receive the digital control codes, convert the digital control codes to an analog staircase sine wave signal, and provide the analog staircase sine wave signal at an output terminal;
an analog to digital converter (ADC) under test including an input terminal connected directly to the output terminal of the DAC to receive the analog staircase sine wave signal and configured to convert the analog staircase sine wave signal to a digital reproduction of the analog staircase sine wave signal;
a performance monitor circuit configured to determine whether the digital reproduction of the analog staircase sine wave signal is within acceptable performance limits during operation in the post-production dynamic test mode;
a multiplexer including a first input, a second input, an output, and a control input configured to select the first input as a mux output during operation in the post-production dynamic test mode and to select the second input as the mux output during operation in a static test mode;
a counter circuit configured to provide counter values to the second input of the multiplexer; and
the CORDIC is configured to provide the digital control codes to the first input of the multiplexer.

2. An integrated circuit in a single semiconductor die comprising:
a coordinate rotation digital computer (CORDIC) configured to generate digital control codes in binary format that correspond to respective portions of a sine wave signal in discrete time steps during operation in a post-production dynamic test mode;
a digital to analog converter (DAC) configured to receive the digital control codes, convert the digital control codes to an analog staircase sine wave signal, and provide the analog staircase sine wave signal at an output terminal;
an analog to digital converter (ADC) under test including an input terminal connected directly to the output terminal of the DAC to receive the analog staircase sine wave signal and configured to convert the analog staircase sine wave signal to a digital reproduction of the analog staircase sine wave signal;
a performance monitor circuit configured to determine whether the digital reproduction of the analog staircase sine wave signal is within acceptable performance limits during operation in the post-production dynamic test mode; and
a calibration ADC including an input terminal connected directly to the output terminal of the DAC to receive an analog ramp signal during operation in a calibration mode, and configured to convert the analog ramp signal to a digital reproduction of the analog ramp signal that is more accurate than a digital reproduction of the analog ramp signal produced by the ADC under test during operation in the calibration mode.

3. The integrated circuit of claim 2 further comprising:
calibration logic configured to generate calibration codes for the digital reproduction of the analog ramp signal produced by the calibration ADC.

4. The integrated circuit of claim 2 further comprising:
a combiner junction configured to combine each of the digital control codes for the sine wave signal with a corresponding calibration code, wherein the DAC receives each portion of the digital control codes with the corresponding calibration code.

5. The integrated circuit of claim 1 further comprising:
a control circuit configured to provide a programmed constant step size to the CORDIC.

6. The integrated circuit of claim 1 wherein:
a sample frequency of the DAC is larger than an output frequency of the DAC.

7. The integrated circuit of claim 6 wherein:
a sample frequency of the ADC under test is an integer multiple of a sample frequency of the DAC.

8. The integrated circuit of claim 1 further comprising:
a digital filter following a sigma-delta modulator portion of the ADC, wherein the digital filter removes high frequency noise and alias images from the reproduction of the analog staircase sine wave signal.

9. The integrated circuit of claim 2 wherein:
the ADC under test has a sigma-delta configuration and the calibration ADC has a Nyquist-rate ADC configuration.

10. The integrated circuit of claim 1 further comprising:
a combiner junction configured to combine the output of the multiplexer with a corresponding calibration code, and the DAC receives output of the combiner junction.

11. An integrated circuit comprising:
a digital sine wave generator configured to produce portions of a digital sine wave;
a combiner circuit configured to output each of the portions of the digital sine wave combined with a respective calibration code during operation in a post-production dynamic test mode;
a digital to analog converter (DAC) configured to output an analog sine wave based on the output of the combiner circuit;
a test analog to digital converter (ADC) including an input terminal directly connected to the output of the DAC, and configured to generate a second digital sine wave based on the analog sine wave;
a multiplexer including a first input, a second input, an output, and a control input configured to select the first input as a mux output during operation in the post-production dynamic test mode and to select the second input as the mux output during operation in a static test mode;
a counter circuit configured to provide counter values to the second input of the multiplexer;

the sine wave generator is configured to provide the control codes to the first input of the multiplexer; and the combiner circuit is configured to receive the output of multiplexer.

12. The integrated circuit of claim 11 further comprising:

a performance monitor circuit configured to determine whether performance characteristics of the second digital sine wave are within specified limits.

13. An integrated circuit comprising:

a digital sine wave generator configured to produce portions of a digital sine wave;

a combiner circuit configured to output each of the portions of the digital sine wave combined with a respective calibration code during operation in a post-production dynamic test mode;

a digital to analog converter (DAC) configured to output an analog sine wave based on the output of the combiner circuit;

a test analog to digital converter (ADC) including an input terminal directly connected to the output of the DAC, and configured to generate a second digital sine wave based on the analog sine wave; and a calibration ADC including an input terminal connected directly to the output terminal of the DAC to receive an analog ramp signal during operation in a calibration mode, and configured to convert the analog ramp signal to a digital reproduction of the analog ramp signal that is more accurate than a digital reproduction of the analog ramp signal produced by the ADC under test during operation in the calibration mode.

14. The integrated circuit of claim 13 further comprising:

calibration logic configured to generate calibration codes for the digital reproduction of the analog ramp signal produced by the calibration ADC.

15. The integrated circuit of claim 11 further comprising:

a control circuit configured to provide a programmed constant step size to the sine wave generator, wherein the sine wave generator is a coordinate rotation digital computer (CORDIC).

16. The integrated circuit of claim 11 wherein:

a sample frequency of the DAC is greater than an output frequency of the DAC; and a sample frequency of the test ADC is an integer multiple of a sample frequency of the DAC.

17. The integrated circuit of claim 12 further comprising:

a digital filter in the test ADC, wherein the digital filter removes high frequency noise and alias images from the second digital sine wave produced by the test ADC.

18. The integrated circuit of claim 2 further comprising:

a control circuit configured to provide a programmed constant step size to the CORDIC.

19. The integrated circuit of claim 2 further comprising:

a digital filter following a sigma-delta modulator portion of the ADC, wherein the digital filter removes high frequency noise and alias images from the reproduction of the analog staircase sine wave signal.

20. The integrated circuit of claim 13 further comprising:

a control circuit configured to provide a programmed constant step size to the sine wave generator, wherein the sine wave generator is a coordinate rotation digital computer (CORDIC).

21. The integrated circuit of claim 13 wherein:

a sample frequency of the DAC is greater than an output frequency of the DAC; and a sample frequency of the test ADC is an integer multiple of a sample frequency of the DAC.

22. The integrated circuit of claim 13 further comprising:

a digital filter in the test ADC, wherein the digital filter removes high frequency noise and alias images from the reproduction of the digital sine wave signal produced by the test ADC.

* * * * *